United States Patent [19]

Sato et al.

[11] Patent Number: 5,416,746
[45] Date of Patent: May 16, 1995

[54] MEMORY CIRCUIT FOR ALTERNATELY ACCESSING DATA WITHIN A PERIOD OF ADDRESS DATA

[75] Inventors: Yasunori Sato; Shosaku Tsukagoshi; Yoshio Sakata, all of Tokyo, Japan

[73] Assignee: Oki Electric Industry Co., Ltd., Tokyo, Japan

[21] Appl. No.: 974,222

[22] Filed: Nov. 10, 1992

[30] Foreign Application Priority Data

Nov. 15, 1991 [JP] Japan .................. 3-300202

[51] Int. Cl.6 .................. G11C 7/00; G11C 8/00
[52] U.S. Cl. .................. 365/230.03; 365/230.08; 365/230.04; 365/230.01; 365/233; 365/236; 365/239; 365/194
[58] Field of Search .................. 365/230.01, 230.03, 365/230.05, 230.06, 230.08, 230.04, 189.05, 194, 233, 236, 239, 154

[56] References Cited

U.S. PATENT DOCUMENTS

| 4,450,538 | 5/1984 | Shirasaka | 365/230.08 |
| 4,849,937 | 7/1989 | Yoshimoto | 365/230.04 |
| 5,016,226 | 5/1991 | Hiwada et al. | 365/230.03 |

OTHER PUBLICATIONS

"HM63021, 2048-wordx8-bit Line Memory", extract from Hitachi IC Memory Databook 1, Sep. 1990, 12th version, pp. 385-396.

"HM53051, 26144-Wordx4-bit Frame Memory", extract from '90 Mitsubishi Semiconductor Memory RAM Data Book, M5M4C264 C-10, -12-15, Sep. 1990, pp. 397-408.

Primary Examiner—Joseph A. Popek
Assistant Examiner—Huan Hoang
Attorney, Agent, or Firm—Spencer, Frank & Schneider

[57] ABSTRACT

A memory circuit includes an input selector for receiving input data serially at an interval of a period T and outputting the input data and an address counter for generating first address data sequentially at an interval of a having period 2T and second address data sequentially at an interval having period 2T. The second address data is delayed a period T from the first address data. The memory circuit of the present invention further includes two memory blocks coupled to the input selector and address counter. One memory block stores even numbered input data in response to the first address data and outputs them at the interval of the period 2T. The other memory block stores odd numbered input data in response to the second address data and outputs them at the interval of the period 2T.

15 Claims, 3 Drawing Sheets

MEMORY CIRCUIT FOR ALTERNATELY ACCESSING DATA WITHIN A PERIOD OF ADDRESS DATA

CROSS REFERENCE TO RELATED APPLICATION

This application claims the priority of Japanese Patent Application Serial No. 3-300,202, filed Nov. 15, 1991, the subject matter of which is incorporated herein by reference.

BACKGROUND OF THE INVENTION

1. Field of the Invention

The present invention relates to a memory circuit suitable for use in a data delay circuit employed in a video system, and particularly to a memory circuit for reading data therefrom and writing the data therein within one address data period.

2. Description of the Related Art

A conventional memory circuit is provided with an I/O (input/output) circuit, an address counter, an address decoder and a memory array. Access to a memory in the conventional memory circuit is controlled by a control signal which is generated based on a master clock signal.

It is thus necessary to increase the frequency of the master clock signal in order to increase the speed of memory access. When a high frequency master clock signal is employed in the memory circuit, the power used up by the memory circuit increases and a high-speed type clock generator is also necessary.

SUMMARY OF THE INVENTION

With the foregoing in view, it is an object of the present invention to provide a memory circuit capable of providing quick-access to a memory without increasing the frequency of a master clock signal. It is another object of the present invention to provide a memory circuit having less power consumption.

The above objects are generally achieved according to the present invention by a memory circuit which comprises an input selector for receiving input data sequentially at an interval, or rate, having a period T and outputting the input data and an address counter for generating first address data sequentially at an interval or rate, having a period 2T. The second address data is delayed a period T from the first address data.

The memory circuit of the present invention further comprises two memory blocks coupled to the input selector and address counter. One memory block stores, for example, even numbered input data in response to the first address data and outputs the data at an interval having period 2T. The other memory block stores, for example odd numbered input data in response to the second address data and outputs the data at an interval having period 2T. The memory circuit of the present invention further comprises an output selector coupled to the memory blocks for receiving the even numbered and odd numbered input data output from the memory blocks and alternately outputting the even numbered and odd numbered input data alternately at an interval having period T and a control circuit coupled to the output selector for controlling an output sequence of the data output from the output selector. Therefore, output data of the memory circuit of the present invention are the same as the input data.

DETAILED DESCRIPTION OF THE PREFERRED EMBODIMENTS

Figure 1:
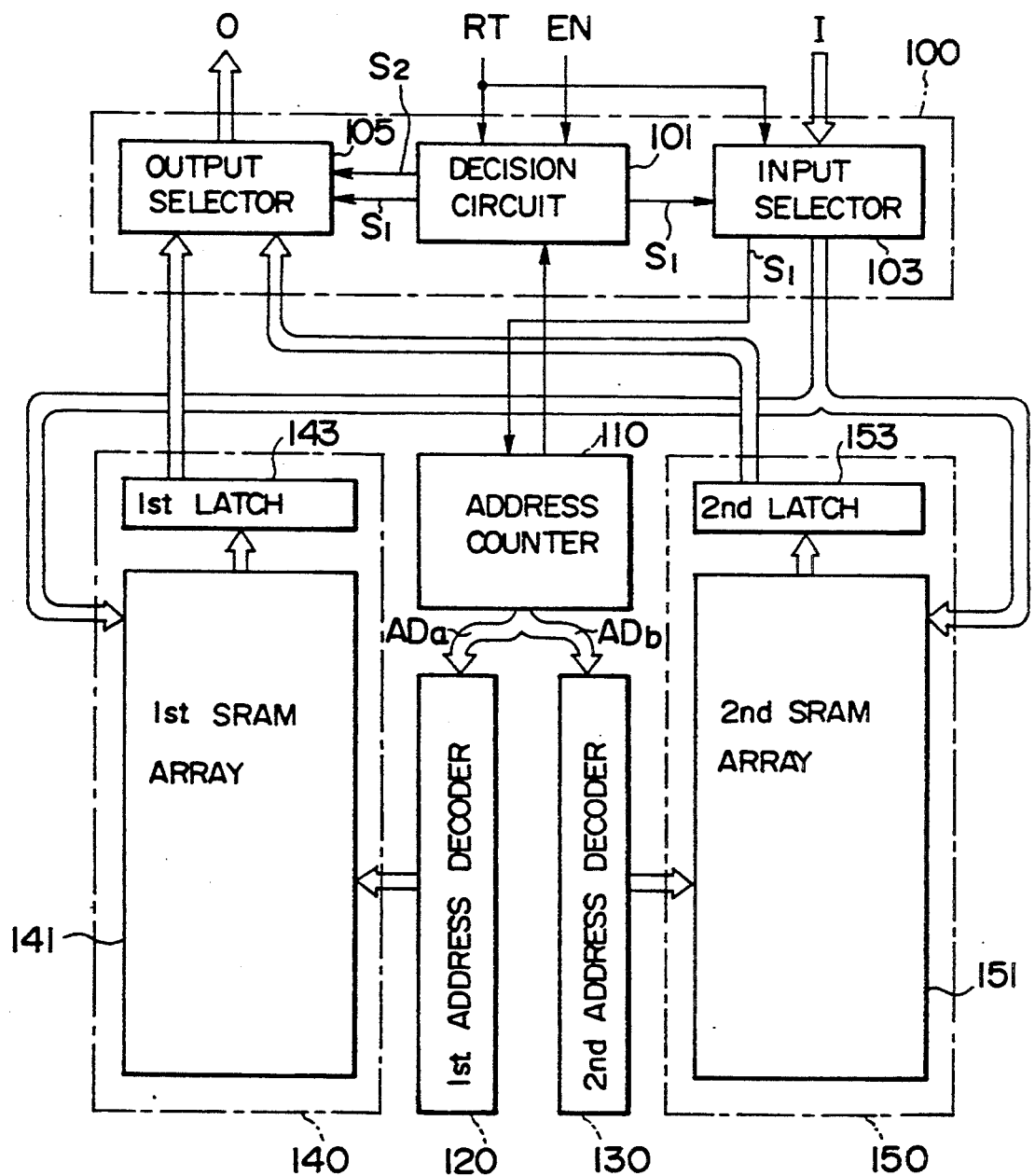
FIG. 1 is a block diagram showing a memory circuit according to one embodiment of the present invention.

FIG. 1 is a block diagram showing the configuration of a memory circuit according to one embodiment of the present invention.

The memory circuit comprises an I/O circuit 100 for inputting and outputting data, an address counter 110 for outputting first and second address data ADa, ADb, first and second address decoders 120, 130 for decoding the first and second address data ADa, ADb respectively, to determine corresponding addresses, and first and second memory blocks 140, 150 for storing data at the determined addresses, respectively.

The I/O circuit 100 comprises a decision circuit 101 for selecting and controlling one of input or output data, an input selector 103 for selecting a reset signal RT based on the result of a decision (output signal) by the decision circuit 101, outputting the selected reset signal RT to the address counter 110 and receiving input data I therein to be output to each of the memory blocks 140, 150, and an output selector 105 for selecting a desired output based on the result of decision by the decision circuit 101, delaying the selected output a given length of time and outputting the so-delayed output externally as output data O. The address counter 110 sets the first and second address data ADa, ADb to their starting data "0" in response to the reset signal RT output from the input selector 103. Further, the address counter 110 counts up to output the first address data ADa and then outputs the second address data ADb delayed ½ period with respect to the first address data ADa. The first and second address decoders 120, 130 decode the first and second address data ADa, ADb, respectively, to determine addresses assigned to the first and second memory blocks 140, 150.

Figure 2:
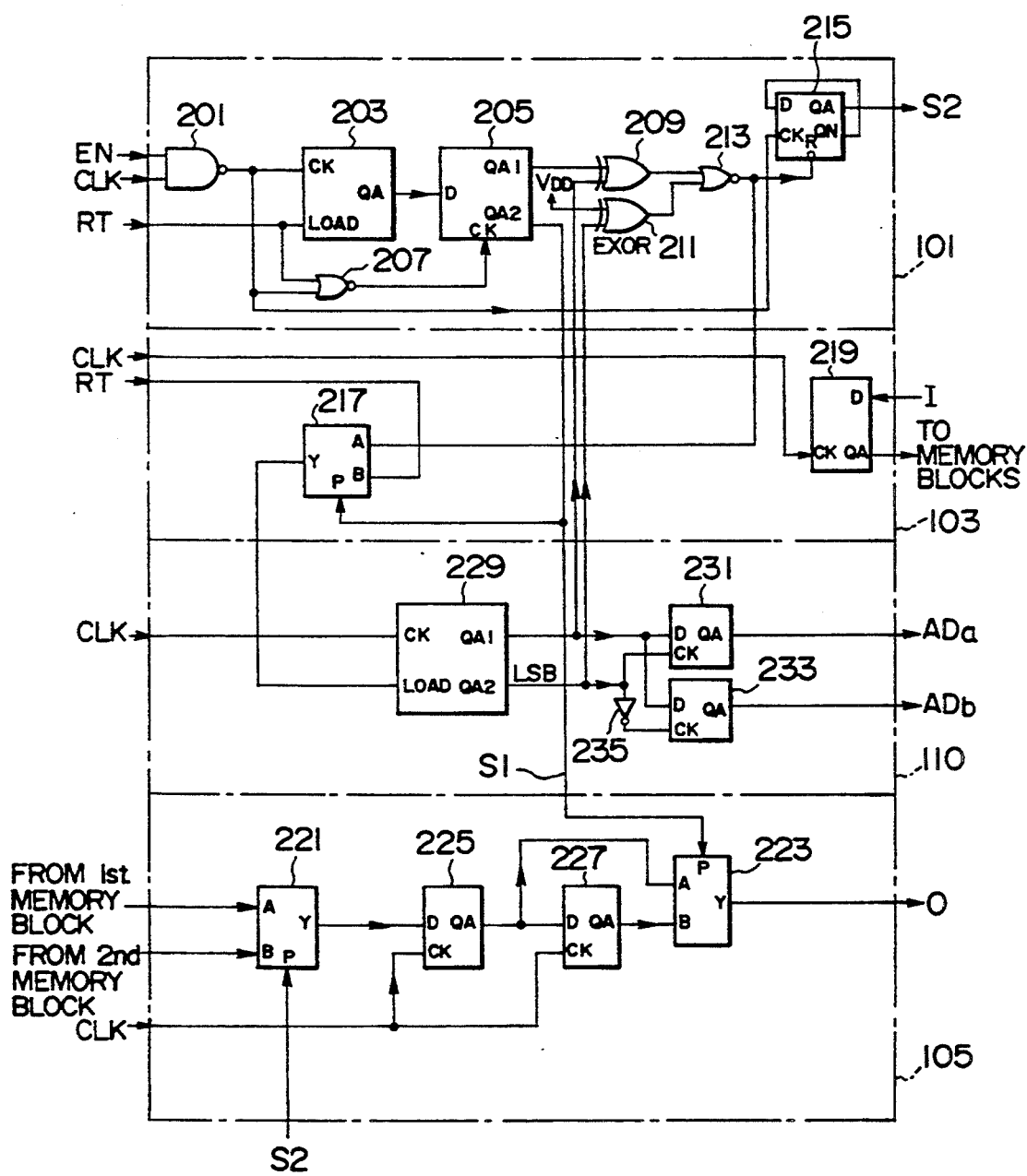
FIG. 2 is a circuit diagram illustrating an I/O circuit and an address counter both of which are employed in the memory circuit shown in FIG. 1.

FIG. 2 is a detailed circuit diagram showing the I/O circuit 100 and the address counter 110 shown in FIG. 1.

The decision circuit 101 comprises a NAND circuit 201, a first n-bit counter 203, an n-bit latch circuit 205, a first NOR circuit 207, a first E(exclusive)-OR circuit 209, a second E-OR circuit 211, a second NOR circuit 213 and a D-flip-flop (hereinafter called a "D-FF") 215 having a reset terminal.

The NAND circuit 201 receives a master clock signal CLK and an enable signal EN therein. The output terminal of the NAND circuit 201 is electrically connected to a clock input CK of the first n-bit counter 203, a second input terminal of the first NOR circuit 207 and a clock input CK of the D-FF 215. The reset signal RT is input to a load input LOAD of the first n-bit counter 203 and a first input terminal of the first NOR circuit 207. The input D of the n-bit latch circuit 205 is electrically connected to the output QA of the first n-bit counter 203. A clock input CK of the n-bit latch circuit 205 is electrically connected to the output of the first NOR circuit 207. The n-bit latch circuit 205 outputs a signal other than an LSB (least significant bit) from a first: output QA1 thereof and outputs a decision signal S1 indicative of the LSB signal from a second output QA2 thereof. A first input terminal of the first E-OR circuit 209 is electrically connected to the first output QA1 of the n-bit latch circuit 205, and a first input terminal of the second E-OR circuit 211 is electrically connected to a voltage source $V_{DD}$. The output terminals of the first and second E-OR circuits 209, 211 are electrically connected to their corresponding first and second input terminals of the second NOR circuit 213. The output terminal of the second NOR circuit 213 is electrically connected to a reset terminal of the D-FF 215. The D-FF 215 has a data input D electrically connected to an inverted output QN of D-FF 215 and outputs a selection signal $2 from the output QA thereof.

The input selector 103 has a first selector 217 and an n-bit D-FF 219. The output terminal of the second NOR circuit 213 is electrically connected to a first input A of the first selector 217. A second input B of the first selector 217 is supplied with a reset signal RT and a control input P of the first selector 217 is supplied with the decision signal S1. A clock input CK of the n-bit D-FF 219 is supplied with a master clock signal CLK and a data input D of the n-bit D-FF 219 is supplied with input data I. In response to the master clock signal CLK, the n-bit D-FF 219 outputs the input data I to the memory blocks 140, 150 from the output QA thereof.

The output selector 105 has second and third selectors 221, 223 and first and second D-FFs 225, 227. First and second inputs A, B of the second selector 221 are supplied with data from the first and second memory blocks 140, 150 respectively. Further, a control input P of the second selector 221 is supplied with a selection signal S2. A data input D of the first D-FF 225 is electrically connected to the output Y of the second selector 221. A clock input CK of the first D-FF 225 is supplied with a master clock signal CLK. A data input D of the second D-FF 227 is electrically connected to the output QA of the first D-FF 225. A clock input CK of the second D-FF 227 is supplied with the master clock signal CLK. A control input P of the third selector 223 is electrically connected to the second output QA2 of the n-bit latch circuit 205 of the decision circuit 101. First and second inputs A, B of the third selector 223 are electrically connected to their corresponding outputs QA of the fir=st and second D-FFs 225, 227. That is, the data from the second selector 221 is supplied to the third selector 223 through the first D-FF with a delay time which is a time difference between outputting the data from the first D-FF 225 and outputting the data from the second selector 221 or through the first and second D-FFs 225 and 227 with a delay time which is a time difference between outputting the data from the second D-FF 227 and outputting the data from the second selector 221 in response to a selection signal S1. The third selector 223 outputs data 0 from the output Y thereof.

The address counter 110 has a second n-bit counter 229, third and fourth D-FFs 231, 233 and an inverter 235. A clock input CK of the second n-bit counter 229 is supplied with a master clock signal CLK. A load input LOAD of the second n-bit counter 229 is electrically connected to the output Y of the first selector 217 of the input selector 103. The second n-bit counter 229 outputs a signal other than an LSB signal from a first output QA1 thereof and outputs the LSB signal from a second output QA2 thereof. The first and second outputs QA1, QA2 of the second n-bit counter 229 are electrically connected to their corresponding second input terminals of the first and second E-OR circuits 209, 211. A data input D of the third D-FF 231 is electrically connected to the first output QA1 of the second n-bit counter 229, whereas a clock input CK of the third D-FF 231 is electrically connected to the second output QA2 of the second n-bit counter 229. A data input D of the fourth D-FF 233 is electrically connected to the first output QA1 of the second n-bit counter 229 and a clock input CK of the fourth D-FF 233 is electrically connected to the second output QA2 of the second n-bit counter 229 via the inverter 235. The third and fourth D-FFs 231, 233 output the first and second address data ADa, ADb from the outputs QA thereof respectively.

Referring now to FIG. 1 again, the first memory block 140 stores data at the address which has been determined by the first address decoder 120. Further, the first memory block 140 comprises a $2^n \times m$-bit type first SRAM array 141 and a first latch circuit 143 having m latches, which latches data output from the first SRAM array 141 and outputs the same to the output selector 105. Similarly, the second memory block 150 stores data at the address which has been determined by the second address decoder 130. In addition, the second memory block 150 comprises a $2^n \times m$-bit type second SRAM array 151 and a second latch circuit 153 having m latches, which latches data output from the second SRAM array 151 and outputs the same to the output selector 105.

The operation of the memory circuit shown in FIG. 1 will now be described below with reference to FIG. 3.

Figure 3:
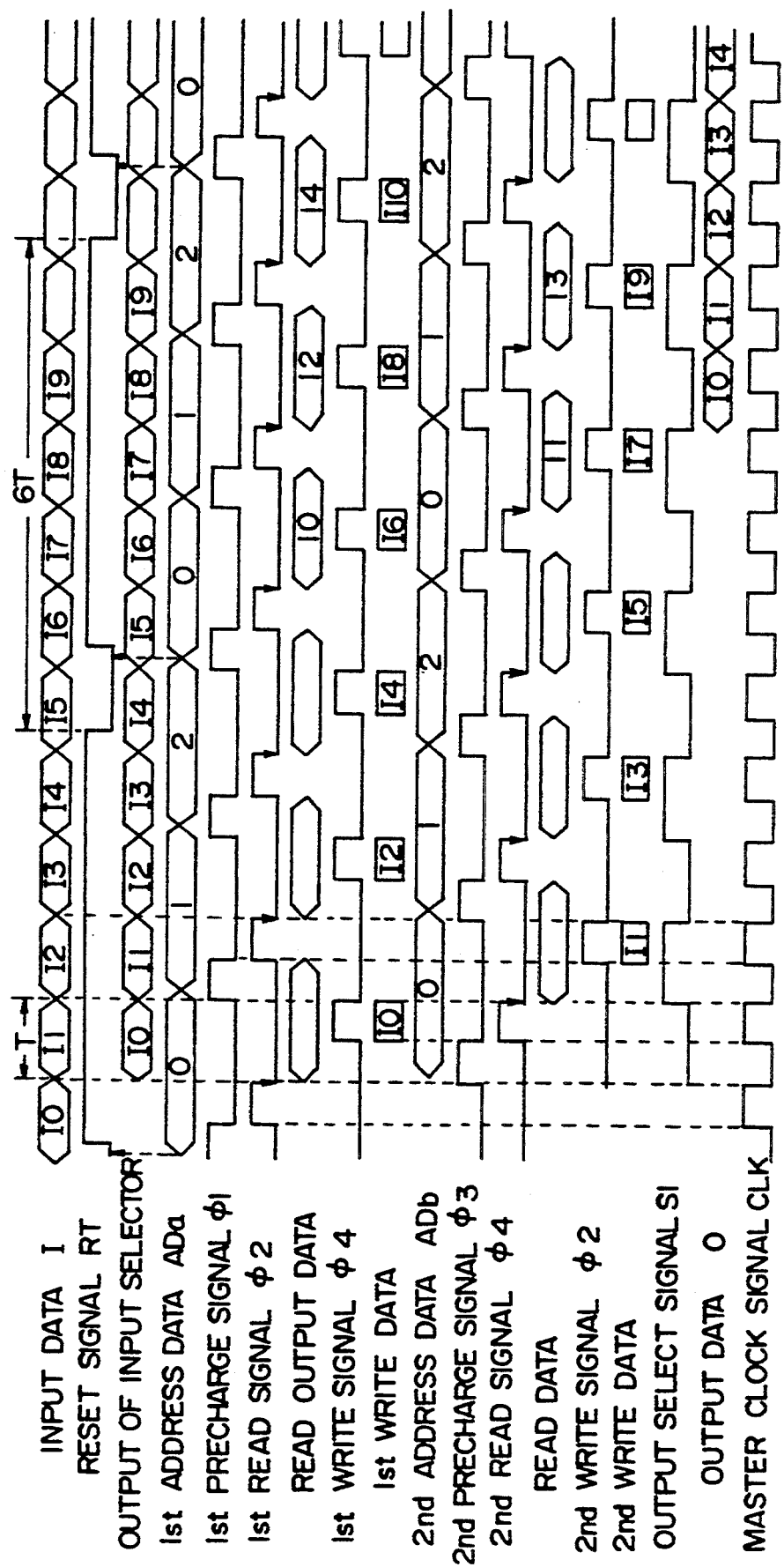
FIG. 3 is a timing chart for describing the operation of the memory circuit shown in FIG. 1.

FIG. 3 is a timing chart for describing the operation of the memory circuit of FIG. 1 which is activated as a data delay circuit. In the same drawing, each of a first precharge signal $\phi 1$, a first read signal $\phi 2$, a second write signal $\phi 2$, a second precharge signal $\phi 3$, a first write signal $\phi 4$ and a second read signal $\phi 4$ represents control signals generated from a control signal generator (not shown) such as a dividing circuit or the like, based on the master clock signal CLK. The first precharge signal $\phi 1$ represents a signal for determining the timing of a precharge operation of the first SRAM array 141. The signals $\phi 2$ represent a read signal (first read signal) for determining the timing of a data reading operation of the first SRAM array 141 and a write signal (second write signal) for determining the timing of a data writing operation of the second SRAM array 151, respectively. The second precharge signal $\phi 3$ represents a signal for determining the timing of a precharge operation of the second SRAM array 151. The signals $\phi 4$ represent a signal (first write signal) for determining the timing of a data writing operation of the first SRAM array 141 and a signal (second read signal) for determining the timing of a data reading operation of the second SRAM array 151.

The operation of the I/O circuit 100 will first be described below with reference to FIG. 2.

When the reset signal RT synchronized with the rising edge of the first address data ADa is first input to the I/O circuit 100, the first n-bit counter 203 in the decision circuit 101 starts to count pulses of the master clock signal CLK. In response to the master clock signal CLK, the input selector 103 first causes the input data I to pass through the n-bit D-FF 219 and then outputs the same to the first and second SRAM arrays 141, 151.

Then, the decision circuit 101 determines a delay cycle or period from the LSB signal output from the n-bit latch circuit 205. The decision circuit 101 outputs the decision signal S1 to the first selector 217 of the input selector 103 and the third selector 223 of the output selector 105. In response to the decision signal S1, the third selector 223 makes a decision as to whether the input data should be allowed to pass through either one D-FF or two D-FFs (i.e., one of the inputs A and B or the-two should be selected). In response to the selection signal S2 output from the D-FF 215 of the decision circuit 101, the second selector 221 of the output selector 105 alternately selects the data output from the first and second latch circuits 143,153 and outputs the selected data to the first D-FF 225. The third selector 223 outputs the data O.

The operation of the memory circuit shown in FIG. 1 will now be described in accordance with the timing chart shown in FIG. 3.

Each of input data I0, I1, I2, ..., Ik (where k: integer greater than or equal to 0) is transmitted at an interval, or rate, having period T. In the present embodiment, the memory circuit shown in FIG. 1 is operated as the data delay circuit at a period of 9T. The period of the reset signal RT is 6T. Since the enable signal EN comprising a write enable signal for permitting a data writing operation and a read enable signal for permitting a data reading operation is taken active, the NAND circuit 201 of the decision circuit 101 outputs the master clock signal CLK. The period of each address data is 2T.

When the reset signal RT which is "H" in level, is input to the decision circuit 101, the decision circuit 101 outputs the decision signal S1 to the first selector 217 of the input selector 103. Then, the second n-bit counter 229 of the address counter 110 is loaded with the initial value 0 from the first selector 217, so that "0" is determined as the address of the first SRAM array 141 by the first address decoder 120. Since, on the other hand, the initial value 0 loaded into the second n-bit counter 229 of the address counter 110 is input to the second address decoder 130 with a delay of a time interval T with respect to the time at which the data is input to the first address decoder 120, the address of the second SRAM array 151 is brought to 0 after the time interval T has elapsed since the determination of the address of the first SRAM array 141.

Next, the first precharge signal $\phi 1$ whose period and clock width are 2T and T/2 respectively, is supplied to the first SRAM array 141. In response to the rising edge of the first precharge signal $\phi 1$, the first SRAM array 141 effects a precharge operation. When, on the other hand, the first read signal $\phi 2$, delayed a period T/2 with respect to the precharge signal $\phi 1$, is supplied to the first SRAM array 141, the first SRAM array 141 reads data in response to the rising edge of the first read signal $\phi 2$. Then, the first write signal $\phi 4$, delayed a period 3T/2 with respect to the first precharge signal $\phi 1$, is supplied to the first SRAM array 141. When the first write signal $\phi 4$ is "H" in level, the first SRAM array 141 effects a data writing operation.

The address of the second SRAM array 151, which is delayed the time interval T with respect to the address of the first SRAM array 141, is determined by the second address decoder 130. When the second precharge signal $\phi 3$, delayed the period T with respect to the first precharge signal $\phi 1$, is supplied to the second SRAM array 151, the second SRAM array 151 effects a precharge operation in response to the rising edge of the second precharge signal $\phi 3$. Then, the second SRAM array 151 performs a data reading operation in response to the rising edge of the second read signal $\phi 4$. During a period in which the second write signal $\phi 2$ is in an "H" level, the second SRAM array 151 effects a data writing operation.

Thus, the second SRAM array 151 performs the data writing operation when the first SRAM array 141 is performing the precharge operation and the data reading operation. When, on the other hand, the data writing operation is being effected by the first SRAM array 141, the second SRAM array 151 performs the precharge operation and the data writing operation. That is, the two arrays of the memory circuit according to the present embodiment effect the alternate operations. Accordingly, even-numbered data I0, I2, I4, ... of the data I0, I1, I2, ..., Ik input to the input selector 103 are written into one SRAM array, for example, the first SRAM array 141, and odd-numbered data I1, I3, I5, ... of the input data I0, I1, I2, ... Ik are written into the other SRAM array, for example, the second SRAM array 151.

The address counter 110 repeatedly counts up and is loaded with the initial value 0, i.e., the address 0 in response to the input reset signal RT which is "H" in level. At this time, the first and second latch circuits 143,153 latch the data read from the first and second SRAM arrays 141, 151 in response to the falling edges of the first and second read signals $\phi 2$, $\phi 4$, respectively. Either one of the latched data is selected by the output selector 105 which is activated in response to the decision signal S1 output from the decision circuit 101. At this time, the data thus selected is delayed a predetermined time interval. Therefore, each data selected is finally output at the interval of the period T in order of input. Further, new data can also be written within the same address data.

Thus, the memory circuit according to the present embodiment alternately writes data into the first and second SRAM arrays 141, 151 during the period 2T of each of the first and second address data ADa, ADb. Further, the memory circuit controls the period of the reset signal RT to delay data a predetermined length of time.

According to the memory circuit of the present invention, as has been described above in detail, the time interval required to obtain access to the first and second memory blocks is delayed one-half T the period 2T of each address data and the access to the first and second memory blocks is alternately carried out. It is therefore possible to effect both data reading and writing processes during one period of each address data. In the memory circuit as well, the period of the master clock signal CLK used to produce each of the signals $\phi 1$, $\phi 2$, $\phi 3$, $\phi 4$, may be T or longer. Therefore, the power consumption of the device can be reduced and a high-speed type clock generator or the like is unnecessary. Further, the memory circuit reads and writes data from and into the first and second memory blocks. Therefore, the first and second memory blocks can be reduced in storage capacity and hence the memory circuit can be reduced in scale.

Having now fully described the invention, it will be apparent to those skilled in the art that many changes and modifications can be made without departing from the spirit or scope of the invention as set forth herein.

What is claimed is:

1. A memory circuit comprising:

an input selector for sequentially receiving a plurality of input data having an interval of a first period and outputting the input data in response to a clock signal, the input data being numbered serially as even numbered data and odd numbered data;

an address counter for sequentially generating a plurality of first address data in response to a first control signal, the first address data having an interval of a second period, the interval of the second period having a length twice a length of the interval of the first period, and for sequentially generating a plurality of second address data in response to the first control signal, the second address data having the interval of the second period, the second address data being delayed the interval of the first period from the first address data;

a first memory block coupled to said input selector and said address counter for storing the even numbered data in response to the first address data and outputting the even numbered input data at the interval of the second period;

a second memory block coupled to said input selector and said address counter for storing the odd numbered input data in response to the second address data and outputting the odd numbered input data at the interval of the second period;

an output selector coupled to said first and second memory blocks for alternately receiving the even numbered and odd numbered input data output from said first and second memory blocks and outputting the even numbered and odd numbered input data alternatively at the interval of the first period in response to the first control signal and a second control signal so that the data output from the output selector are the same as the input data; and a control circuit coupled to said address counter and said output selector for generating the first and second control signals to control generation of the first and second address data and an output sequence of the data output from the output selector.

2. A memory circuit according to claim 1, wherein said address counter generates the first and second address data in response to the clock signal.

3. A memory circuit according to claim 1, wherein said control circuit receives a reset signal and outputs the first control signal to said output selector in response to the reset signal.

4. A memory circuit according to claim 1, wherein said first memory block includes:
a first address decoder coupled to said address counter for deciding a first address in response to the first address data;
a first memory array coupled to said input selector and the first address decoder for storing the even numbered input data at the first address; and
a first latch circuit coupled to said output selector and the first memory array for latching the even numbered input data output from the first memory array.

5. A memory circuit according to claim 4, wherein the first memory array is a static memory array.

6. A memory circuit according to claim 1, wherein said second memory block includes:
a second address decoder coupled to said address counter for deciding a second address in response to the second address data;
a second memory array coupled to said input selector and the second address decoder for storing the odd numbered input data at a second address; and
a second latch circuit coupled to said output selector and the second memory array for latching the odd numbered input data output from the second memory array.

7. A memory circuit according to claim 6, wherein the second memory array is a static memory array.

8. A memory circuit comprising:
a decision circuit receiving a reset signal and a clock signal and outputting first and second control signals in response to the received signals;
an input selector for receiving input data at an interval having a first period and the clock signal and outputting the input data in response to the clock signal, the input data including first input data and second input data being serial to the first data;
an address counter for generating first and second address data in response to the first control signals, the clock signal and the reset signal, and serially outputting the first address data at an interval having a second period and the second address data at an interval having the second period, the second period having a duration which is twice a duration of the first period and the second address data being delayed for a duration equal to the first period with respect to the first address data;
a first memory block coupled to said input selector and said address counter for storing the first input data on every other first period in response to the first address data and outputting the first input data stored therein at the interval of the second period;
a second memory block coupled to said input selector and said address counter for storing the second input data on every other first period in response to the second address data and outputting the second input data stored therein at the interval of the second period; and
an output selector coupled to said decision circuit and said first and second memory blocks for receiving the input data output from said first and second memory blocks and outputting the input data output from said first and second memory blocks alternately at an interval of the first period in response to the first and second control signals so that the data output from the output selector are same as the input data.

9. A memory circuit according to claim 8, wherein said output selector includes:
an input selection circuit coupled to said decision circuit and said first and second memory blocks for selecting a first output data from the data output of said first and second memory blocks and outputting the first output data in response to the first control signal; and
a delay selection circuit coupled to the input selection circuit and said decision circuit for selecting a second output data from data delayed a third period from the first output data and data delayed from a fourth period from the first output data and outputting the second data in response to the second control signal.

10. A memory circuit according to claim 8, wherein said first memory block includes:
a first address decoder coupled to said address counter for deciding a first address in response to the first address data;

a first memory array coupled to said input selector and the first address decoder for storing the input data on every other first period from the first input data at a first address; and a first latch circuit coupled to said output selector and the first memory array for latching the input data on every other first period from the first input data output from the first memory array.

11. A memory circuit according to claim 8, wherein said second memory block-includes:

a second address decoder coupled to said address counter for deciding a second address in response to the second address data;

a second memory array coupled to said input selector and the second address decoder for storing the input data on every other first period from the second input data at a second address; and a second latch circuit coupled to said output selector and the second memory array for latching the input data on every other first period from the second input data output from the second memory array.

12. A memory circuit according to claim 8, wherein said input selector is coupled to said decision circuit and said address counter.

13. A memory circuit according to claim 12, wherein said input selector receives the reset signal and outputs the reset signal in response to the second control signal.

14. A memory circuit according to claim 13, wherein said address counter is coupled to the input selector and generates the first and second address data in response to the clock signal and the reset signal output from said input selector.

15. A memory circuit comprising:

an input selector for receiving a plurality of first and second input data alternately at an interval of a first period and outputting the received first and second input data in response to a clock signal;

an address counter for generating first and second address data at an interval having a second period in response to a first control signal, each of the first and second address data having a plurality of data, the second period having a length which is twice a length of the first period, the second address data being delayed a half of the second period from the first address data;

a first address decoder coupled to said address counter for deciding a first address in response to the first address data;

a second address decoder coupled, to said address counter for deciding a second address in response to the second address data;

a first memory block coupled to said input selector and said first address decoder for storing the first input data at the first address in response to a first write signal, the first write signal having an interval of the second period, and outputting the stored first input data in response to a first read signal;

a second memory block coupled to said input selector and said second address decoder for storing the second input data at the second address in response to a second write signal, the second write signal having an interval of the second period, and outputting the stored second input data in response to a second read signal;

an output selector coupled to said first and second memory blocks for receiving the first and second input data from said first and second memory blocks and outputting the first and second input data alternately at an interval of the first period in response to the first control signal and a second control signal; and a control circuit coupled to said output selector for generating the first and second control signals to control generation of the first and second address data and an output sequence of the output selector.

* * * * *